(12) United States Patent
Hayashi et al.

(10) Patent No.: US 7,554,162 B2
(45) Date of Patent: Jun. 30, 2009

(54) THIN FILM TRANSISTOR SUBSTRATE WITH LOW REFLECTANCE UPPER ELECTRODE

(75) Inventors: Kenichi Hayashi, Tokyo (JP); Hirofumi Shimamoto, Tokyo (JP); Tadahiro Matsuzaki, Tokyo (JP)

(73) Assignee: NEC Corporation, Tokyo (JP)

( * ) Notice: Subject to any disclaimer, the term of this patent is extended or adjusted under 35 U.S.C. 154(b) by 51 days.

(21) Appl. No.: 10/873,149

(22) Filed: Jun. 23, 2004

(65) Prior Publication Data

US 2005/0062042 A1    Mar. 24, 2005

(30) Foreign Application Priority Data

Sep. 19, 2003    (JP)    ............... 2003-328808

(51) Int. Cl.
| | |
|---|---|
| H01L 29/18 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ............ 257/383; 257/88; 257/E23.163; 257/E31.126; 257/E33.064; 438/155

(58) Field of Classification Search ............ 257/83, 257/59, 57, 84, 88, E23.163, E31.126, E33.064, 257/383; 438/155
See application file for complete search history.

(56) References Cited

U.S. PATENT DOCUMENTS

| | | | | |
|---|---|---|---|---|
| 4,161,430 A | * | 7/1979 | Sogo | 205/124 |
| 5,061,985 A | * | 10/1991 | Meguro et al. | 257/751 |
| 5,717,473 A | * | 2/1998 | Miyawaki | 349/43 |
| 5,917,563 A | * | 6/1999 | Matsushima | 349/122 |
| 6,016,033 A | * | 1/2000 | Jones et al. | 313/506 |
| 6,025,218 A | * | 2/2000 | Brotherton | 438/166 |
| 6,376,861 B1 | * | 4/2002 | Yaegashi et al. | 257/59 |

FOREIGN PATENT DOCUMENTS

| | | |
|---|---|---|
| JP | 9-307113 | 11/1997 |
| JP | 10-65174 | 3/1998 |
| JP | 2000-131716 | 5/2000 |

* cited by examiner

*Primary Examiner*—Howard Weiss
*Assistant Examiner*—John C Ingham
(74) *Attorney, Agent, or Firm*—Young & Thompson

(57) ABSTRACT

A thin film transistor substrate includes an upper electrode for electrically connecting a transparent picture element electrode to the thin film transistor. The upper electrode includes at least a first metal layer and a second metal layer formed on the first metal layer. The second metal layer has a lower reflectance than the first metal layer and the first metal layer has a region not overlapped by the second metal layer.

9 Claims, 20 Drawing Sheets

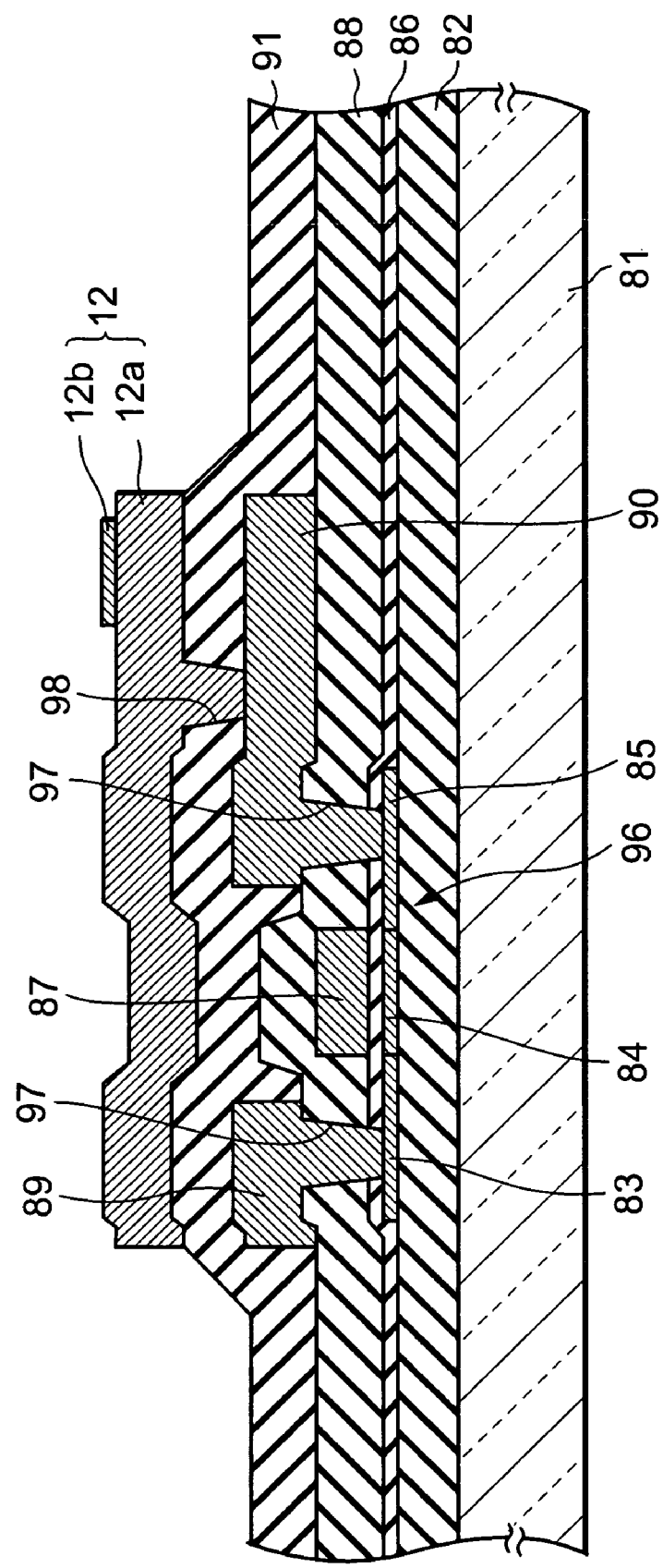

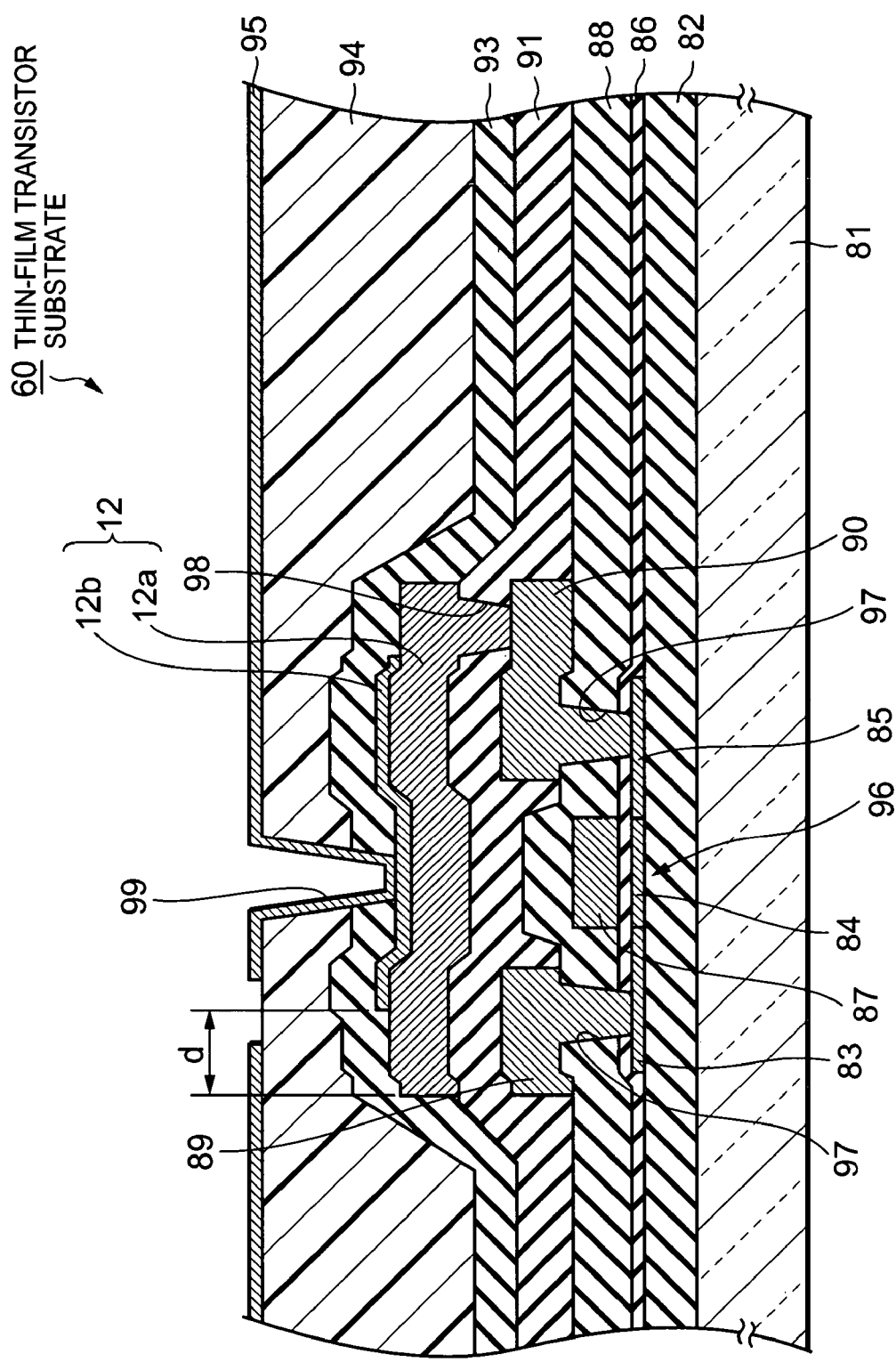

THIN FILM TRANSISTOR SUBSTRATE WITH LOW REFLECTANCE UPPER ELECTRODE

CROSS-REFFERENCE TO RELATED APPLICATIONS

The disclosure of Japanese Patent Application No. JP2003-328808 filed on Sep. 19, 2003 including the specification, drawings and abstract is incorporated herein by reference in its entirety.

BACKGROUND OF THE INVENTION

1. Field of the Invention

The present invention relates to a thin film transistor substrate, and more particularly to a thin film transistor substrate in which the heat generation by optical incidence is inhibited. The invention also relates to a method of manufacture of the thin film transistor substrate.

2. Description of Related Art

In a liquid crystal display using a thin film transistor, to increase the number of picture elements, the miniaturization of electrodes and wiring is increasing. Therefore, the use of metal mainly composed of Al with low electric resistance for the electrode material has become conventional.

However, when a picture element electrode made of indium tin oxide (ITO) is to be connected to an electrode made of a metal mainly composed of Al, There may be insufficient contact. This failure is caused by an insulating oxide film that is formed on the surface of the electrode made of the metal mainly composed of Al by natural oxidation or by an oxidized atmosphere in a chamber when the ITO is sputtered.

To make a contact properly between the electrode made of the metal mainly composed of Al and the picture element electrode made of ITO, for example, Japanese Patent Laid-Open No. JP-A-10-65174 (patent document 1) discloses a high-melting point metal such as Ti, W, Mo, Ta and Cr is laminated on the metal mainly composed of Al in a thin film transistor. These high-melting point metals can cause a satisfactory contact with ITO because they are conductive even if the surface is oxidized. In addition, in a thin film transistor disclosed in Japanese Patent Laid-Open No. JP-A-9-307113 (patent document 2), satisfactory contact with ITO is achieved by laminating Ti and TiN on metal mainly composed of Al.

FIG. 12 is a sectional view showing conventional type thin film transistor substrate. Referring to this drawing, the conventional type thin film transistor substrate will be described below.

A base insulating film 82 formed by a $SiO_2$ film is formed on transparent base substrate 81 made of glass or suitable material. Thin film transistor 96 includes active layer that is made of polycrystalline silicon and that includes a drain region 83, a channel region 84 and a source region 85. The active layer is formed on the base insulating film 82 in the shape of an island. Impurities such as phosphorus are added to the drain region 83 and the source region 85 to reduce resistance. A gate insulating film 86 formed by a $SiO_2$ film is formed on the active layer. A gate electrode 87 made of metal, metal silicide or polysilicon to which impurities are added is formed over the channel region 84 with the gate insulating film 86 between the gate electrode and the channel region.

A first insulating interlayer 88 formed of a $SiO_2$ film or other suitable material is formed on the gate electrode 87 so that the first insulating interlayer covers the entire surface. A drain electrode 89 and a source electrode 90 respectively made of metal mainly composed of Al or suitable material is formed on the first insulating interlayer 88. The drain electrode 89 and the source electrode 90 are connected to the drain region 83 and the source region 85 via contact holes 97 made in the first insulating interlayer 88 and the gate insulating film 86.

A second insulating interlayer 91 formed of a $SiO_2$ film or a silicon nitride film or suitable material is formed on the drain electrode 89 and the source electrode 90 so that the second insulating interlayer covers the overall surface. An upper electrode 92 is formed on the second insulating interlayer 91 so that the upper electrode covers the active layer of the thin film transistor 96 to prevent light from being incident on the active layer of the thin film transistor 96. The upper electrode 92 is composed of a lamination of an upper high-melting point metal layer 92b made of Ti, W, Mo, Ta or Cr whose contact with ITO is satisfactory and a second Al metal layer 92a mainly including Al. The upper electrode 92 is connected to the source electrode 90 via a contact hole 98 made in the second insulating interlayer 91.

A third insulating interlayer 93 formed by a $SiO_2$ film or a silicon nitride film and others and a flattening film 94 made of acrylic resin are formed on the upper electrode 92 so that the third insulating interlayer 93 and the flattening film 94 cover the overall surface. A picture element electrode 95 made of ITO is formed on the flattening film 94. The picture element electrode 95 is connected to the high-melting point metal layer 92b of the upper electrode 92 via a contact hole 99 made in the flattening film 94 and the third insulating interlayer 93.

FIG. 13 is a sectional view showing a liquid crystal display using the above-described conventional type thin film transistor substrate. A thin film transistor substrate 80 where multiple thin film transistors 96 are formed is bonded to an opposite substrate 102 on which an opposite electrode 101 made of ITO with a predetermined separation. A liquid crystal display 100 is formed by filling the separation with a liquid crystal 103. In case the liquid crystal display 100 is used for a liquid crystal projector using a high-intensity light source, there is a problem that unevenness occurs in a projected image because the thin film transistor substrate 80 is distorted by heat caused during projection, which causes an interval between the picture element electrode 95 and the opposite electrode 101 to vary which cause the dispersion to increase.

In the liquid crystal display 100 used for the liquid crystal projector, generally, projected light P is incident from the side of the opposite substrate 102. Apart of the incident light reaches the upper electrode 92 formed in the thin film transistor substrate 80. The upper layer of the upper electrode 92 includes the high-melting point metal layer 92b. The reflectance of layer 92b is approximately 70% at most and is smaller, compared with an Al alloy showing the reflectance of approximately 90%. Therefore, the high-melting point metal layer 92b absorbs a part of the light that reaches the upper electrode 92 and as a result, heat increases.

SUMMARY OF THE INVENTION

An object of the present invention is to solve these problems by providing a thin film transistor substrate in which the heat generation by optical incidence is inhibited and the failure of an image caused by the distortion of a substrate by heat is reduced.

A thin film transistor substrate of the present invention includes an upper electrode for electrically connecting the picture element electrode and the thin film transistor. The upper electrode includes at least a first metal layer and a second metal layer formed on the first metal layer. The second metal layer has a lower reflectance than the first metal layer and the first metal layer has a region being overlapped by the second metal layer.

Therefore, as the absorbed amount of light is reduced and the amount of generated heat is reduced due to the increased reflectance of the exposed region of the first metal layer, the failures caused by the distortion of the substrate by the heat are reduced.

BRIEF DESCRIPTION OF THE DRAWINGS

FIGS. 2A-C are a sectional views showing a manufacturing method of the thin film transistor substrate shown in FIG. 1;

FIG. 8 is a sectional view showing a third embodiment of the thin film transistor substrate according to the present invention;

DETAILED DESCRIPTION OF PREFERRED EMBODIMENTS

Figure 1:
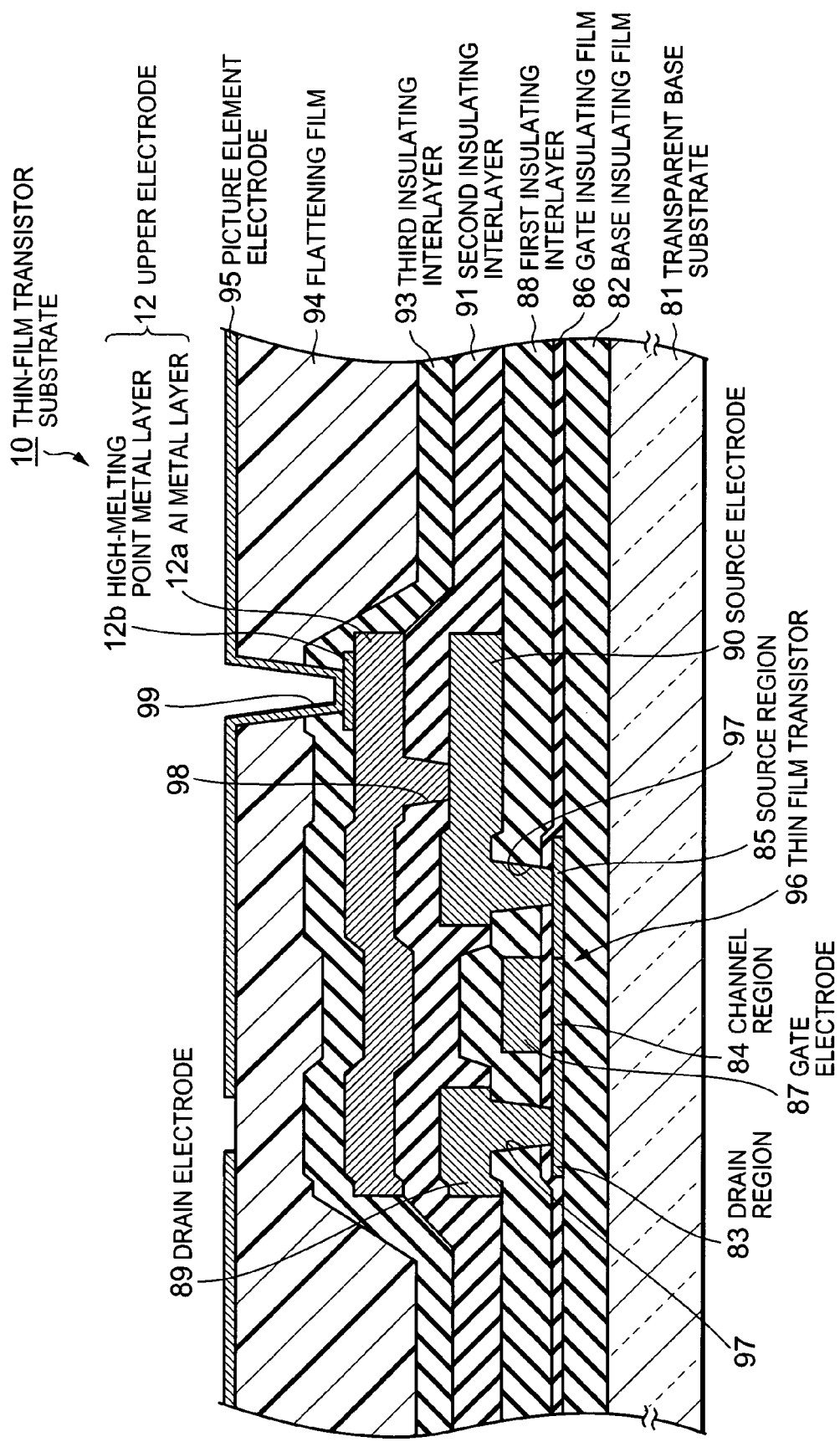
FIG. 1 is a sectional view showing a first embodiment of a thin film transistor substrate according to the present invention.

FIG. 1 is a sectional view showing a first embodiment of a thin film transistor substrate according to the present invention. Where the same reference number is allocated to the same part as the part shown in FIG. 12, the description is omitted.

A thin film-transistor substrate 10 is provided with a thin film transistor 96 provided over transparent base substrate 81, a picture element electrode 95 provided over the thin film transistor 96 and an upper electrode 12 provided between the picture element electrode 95 and the thin film transistor 96 for electrically connecting the picture element electrode 95 and the thin film transistor 96. Light is incident from the side of the picture element electrode 95. The upper electrode 12 is provided with an Al metal layer 12a mainly composed of Al and a high-melting point metal layer 12b provided on the Al metal layer 12a that touched the picture element electrode 95. The contact resistance with the picture element electrode 95 of the high-melting point metal layer 12b is lower, compared with the Al metal layer 12a, and the high-melting point metal layer has high resistivity and low reflectance. The thin film transistor substrate 10 is characterized in that there is a region in which no high-melting point metal layer 12b is provided on the Al metal layer 12a.

As shown in FIG. 1, a second insulating interlayer 91 is provided between the thin film transistor 96 and the Al metal layer 12a, a third insulating interlayer 93 is provided between the high-melting point metal layer 12b and the picture element electrode 95, a contact hole 98 is made in the second insulating interlayer 91, the thin film transistor 96 and the Al metal layer 12a are electrically connected via the contact hole 98, a contact hole 99 is made in the third insulating interlayer 93, and the high-melting point metal layer 12b and the picture element electrode 95 are electrically connected via the contact hole 99. As the upper electrode 12 is provided in a position for preventing projected light from being incident upon the thin film transistor 96, the upper electrode also functions as a shielding film.

The thin film transistor 96 is turned ON/OFF according to a signal input to a gate electrode 87 and applies voltage to the picture element electrode 95 via the upper electrode 12. For the upper electrode 12, the Al metal layer 12a having lower resistivity and higher reflectance than layer 12b is used to prevent a delay caused by electric resistance and to prevent projected light from the side of the picture element electrode 95 from reaching the active layer of the thin film resistor. The high-melting point metal layer 12b is used to reduce the contact resistance with the picture element electrode 95.

Figure 12:
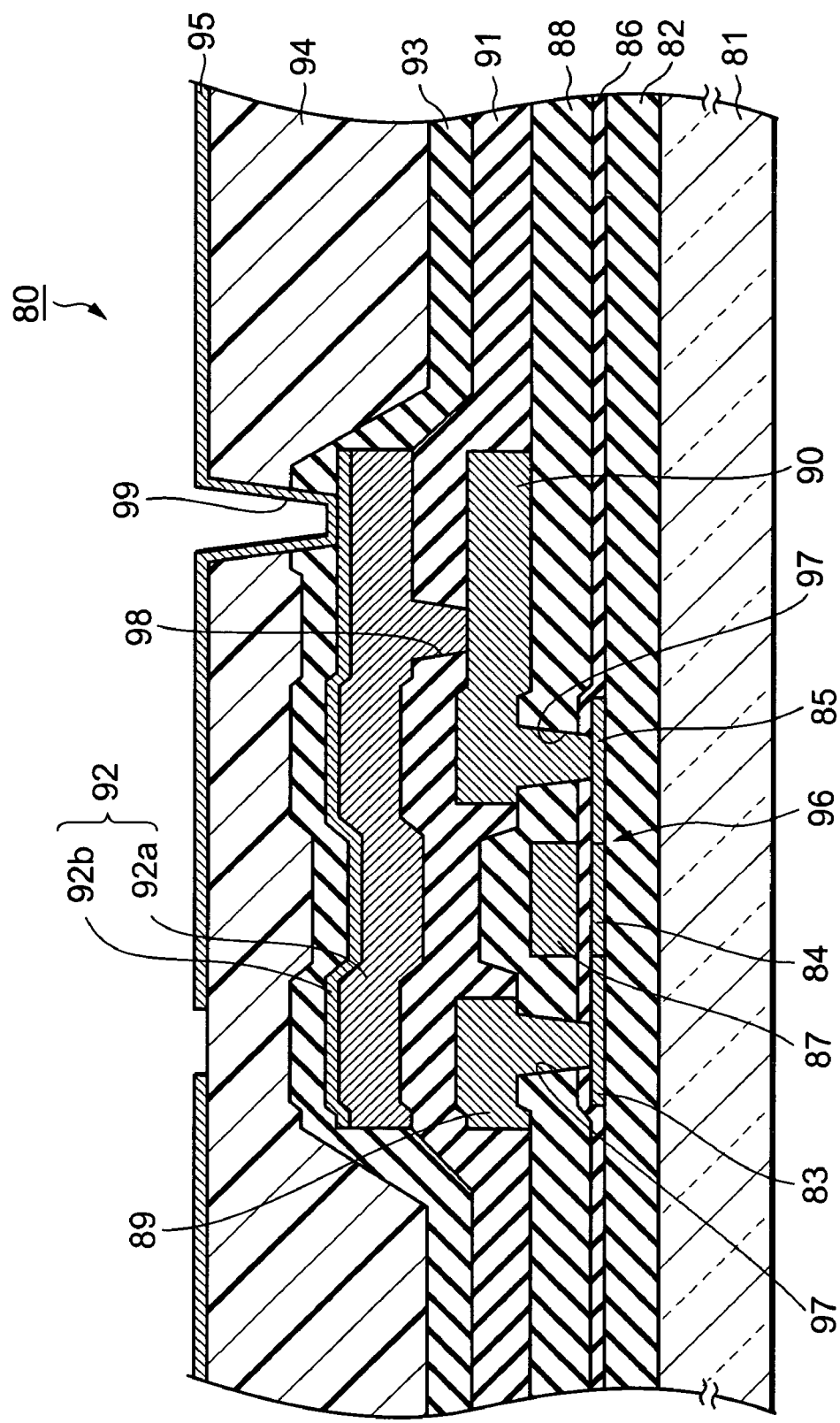
FIG. 12 is a sectional view showing a conventional type thin film transistor substrate.
Figure 13:
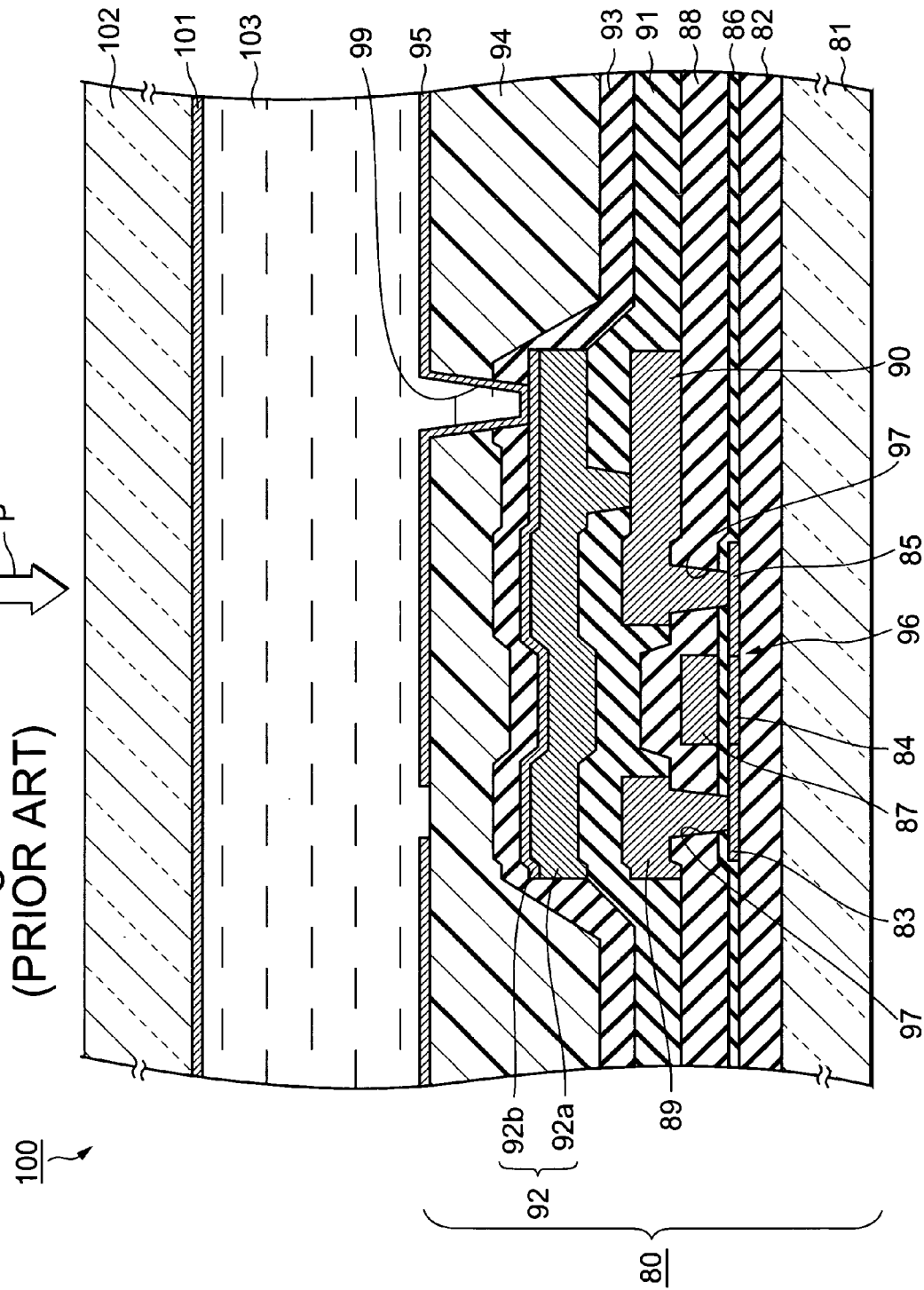
FIG. 13 is a sectional view showing a liquid crystal display using the thin film transistor substrate shown in FIG. 12.

In the prior art shown in FIG. 12, the high-melting point metal layer 92b is provided on the entire surface of the Al metal layer 92a, while in the present invention, the high-melting point metal layer 12b is provided on a part of the Al metal layer 12a. That is, in the prior art, as the high-melting point metal layer 92b having the lower reflectance is provided on the entire side on which projected light is incident in the upper electrode 92, and the distortion of the substrate is caused because the high-melting point metal layer 92b absorbs the projected light and generates heat. In the present embodiment, as the Al metal layer 12a having high reflectance is provided on the side on which projected light is incident of the upper electrode 12, except the part contacting the picture element electrode 95, reflected projected light increases and generated heat is reduced.

Figure 2A:
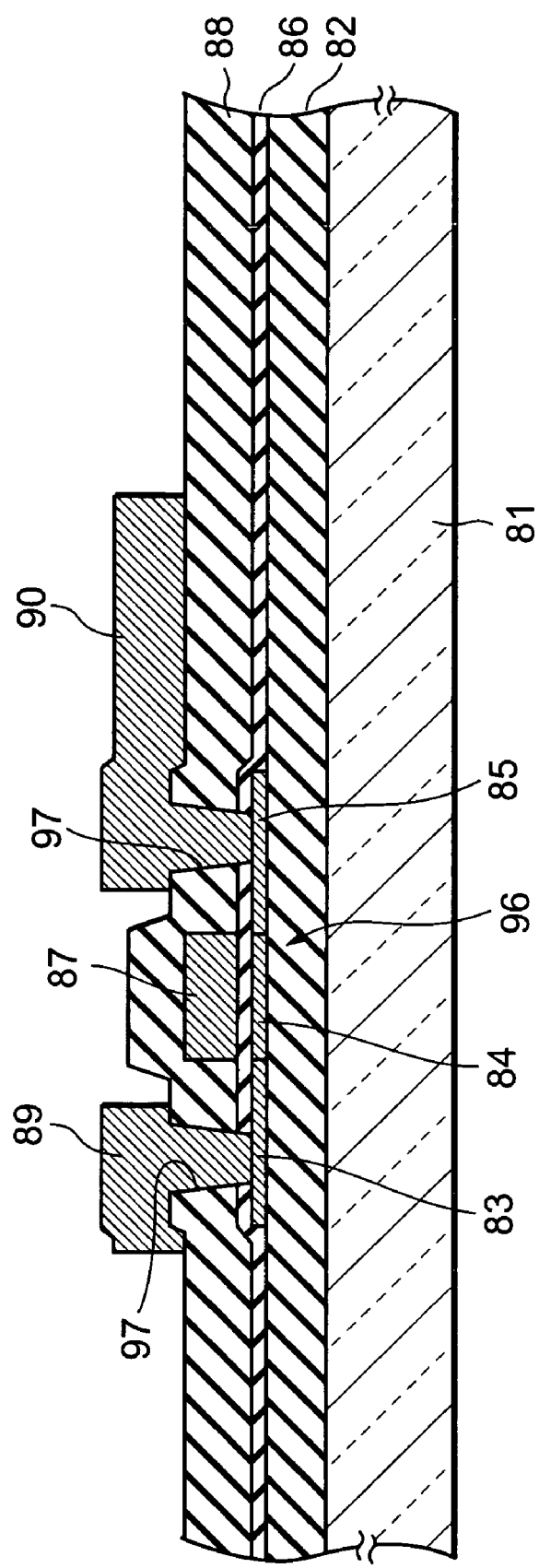
Figure 2B:
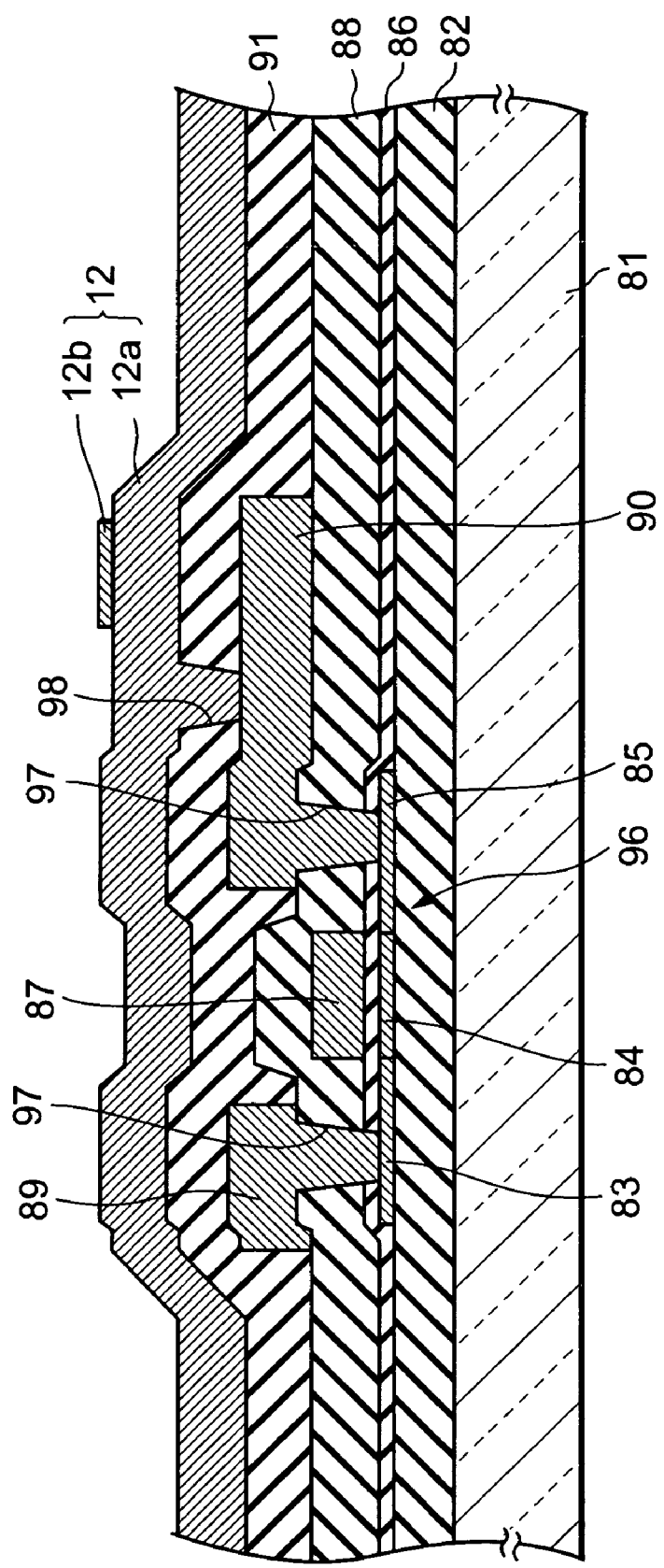

FIGS. 2A-2C are sectional views showing a manufacturing method of the thin film transistor substrate in the first embodiment.

First, as shown in FIG. 2A, a base insulating film 82 of SiO$_2$ film about 300 nm thick or others suitable material is deposited on the transparent base substrate 81 by plasma CVD or low-pressure CVD. The base insulating film 82 prevents contamination by metal diffused from the transparent base substrate 81. Next, an amorphous silicon film is deposited about 10 to 100 nm thick on the base insulating film 82 by prasma CVD or low-pressure. Next, amorphous silicon is crystallized by radiating an excimer laser beam, for example, on an amorphous silicon film goes to form a polycrystalline silicon film. Afterward, the polycrystalline silicon film is patterned in the shape of an island and the active layer of the thin film transistor 96 is formed.

Next, the gate insulating film 86 of a SiO$_2$ about 50 to 150 nm thick is deposited on the active layer of the thin film transistor 96 by plasma CVD or low-pressure CVD. Next, the gate electrode 87 is formed on the gate insulating film 86. For the gate electrode 87, metal or metal silicide deposited by sputtering, polycrystalline silicon which is deposited by low-pressure CVD and to which impurities are doped or a film acquired by laminating polycrystalline silicon to which impurities are doped and metal is used. Next, impurity ions such as phosphorus and boron are implanted in the active layer of the thin film transistor 96 using the gate electrode 87 as a mask by ion implantation or ion doping. Afterward, the implanted impurity ions are activated by a method such as laser annealing or annealing in a furnace, and the drain region 83 and the source region 85 are formed. The region under the gate electrode 87 to which no impurity ions are implanted because the region is masked by the gate electrode 87 becomes the channel region 84.

Next, the first insulating interlayer 88 of $SiO_2$ approximately 400 nm thick or other suitable material is formed by plasma CVD or other suitable method. Afterward, each region equivalent to a part of the first insulating interlayer 88 and the gate insulating film 86 located on the drain region 83 and the source region 85 is selectively etched up to the drain region 83 and the source region 85 respectively formed by a polycrystalline silicon film and each contact hole 97 is made. Next, metal mainly composed of Al is deposited about 300 to about 500 nm thick by sputtering, is processed in a predetermined shape, and the drain electrode 89 and the source electrode 90 are formed.

Next, as shown in FIG. 2B, the second insulating interlayer 91 of $SiO_2$ or silicon nitride or suitable material is deposited by plasma CVD and others process. Afterward, a part of the second insulating interlayer 91 located on the source, electrode 90 is selectively etched up to the source electrode 90 made of metal mainly composed of Al and the contact hole 98 is made.

Next, the Al metal layer 12a about 300 to about 500 nm is deposited by sputtering and succeedingly, the high-melting point metal layer 12b is formed to a thickness of 50 to 200 nm. Afterward, the high-melting point metal layer 12b is selectively etched up to the Al metal layer 12a by photolithography to be a predetermined shape and the Al metal layer 12a is exposed in the region in which the high-melting point metal layer 12b is etched.

The high-melting point metal layer 12b may be any of Ti, W, Mo, Ta, Cr or an alloy of a combination of two or more out of Ti, W, Mo, Ta, Cr. In case any of Ti, W, Mo, Ta or an alloy combination of two or more out of Ti, W, Mo, Ta is used, the high-melting point metal layer 12b may be etched using a fluorine compound or mixed gas of a fluorine compound and oxygen such as $SF_6$, $CF_4$, $SF_6+O_2$ and $CF_4+O_2$ by dry etching. Ti, W, Mo and Ta may be etched by the above-mentioned fluorine gas, however, Al cannot be etched by fluorine gas. Therefore, sufficient etching selective ratio to the Al metal layer 12a is achieved by using fluoric gas.

In case Cr is used for the high-melting point metal layer 12b, the high-melting point metal layer 12b may be etched using mixed gas of chlorine and oxygen by dry etching. Cr may be etched by mixed gas of chlorine and oxygen. Al may be etched by chlorine gas, however, Al cannot be etched because oxide is formed on the surface by mixed gas of chlorine and oxygen. Therefore, sufficient etching selective ratio to the Al metal layer 12a is achieved by using mixed gas of chlorine and oxygen. In case any of W, Mo, Ta or an alloy of combination of two or more out of Cr, W, Mo, Ta is used for the high-melting point metal layer 12b, mixed gas of chlorine and oxygen may be also used for etching the high-melting point metal layer 12b.

Next, shown in FIG. 2C, the Al metal layer 12a is processed in a predetermined shape by photolithography and the upper electrode 12 is completed.

As shown in FIG. 1, the third insulating interlayer 93 of $SiO_2$ or silicon nitride is deposited to a thickness of by approximately 400 nm by plasma CVD or other process. Succeedingly, the flattening film 94 made of acrylic resin, for example, is applied by spinning so that it has the thickness of 1 to 3 μm on average. Afterward, apart of the flattening film 94 and the third insulating interlayer 93 located on the high-melting point metal layer 12b is selectively etched up to the high-melting point metal layer 12b and the contact hole 99 is made. Next, a transparent conductive thin film 50 to 200 nm thick made of ITO or other suitable material is deposited by sputtering, is processed in a predetermined shape and the picture element electrode 95 is formed.

Figure 3:
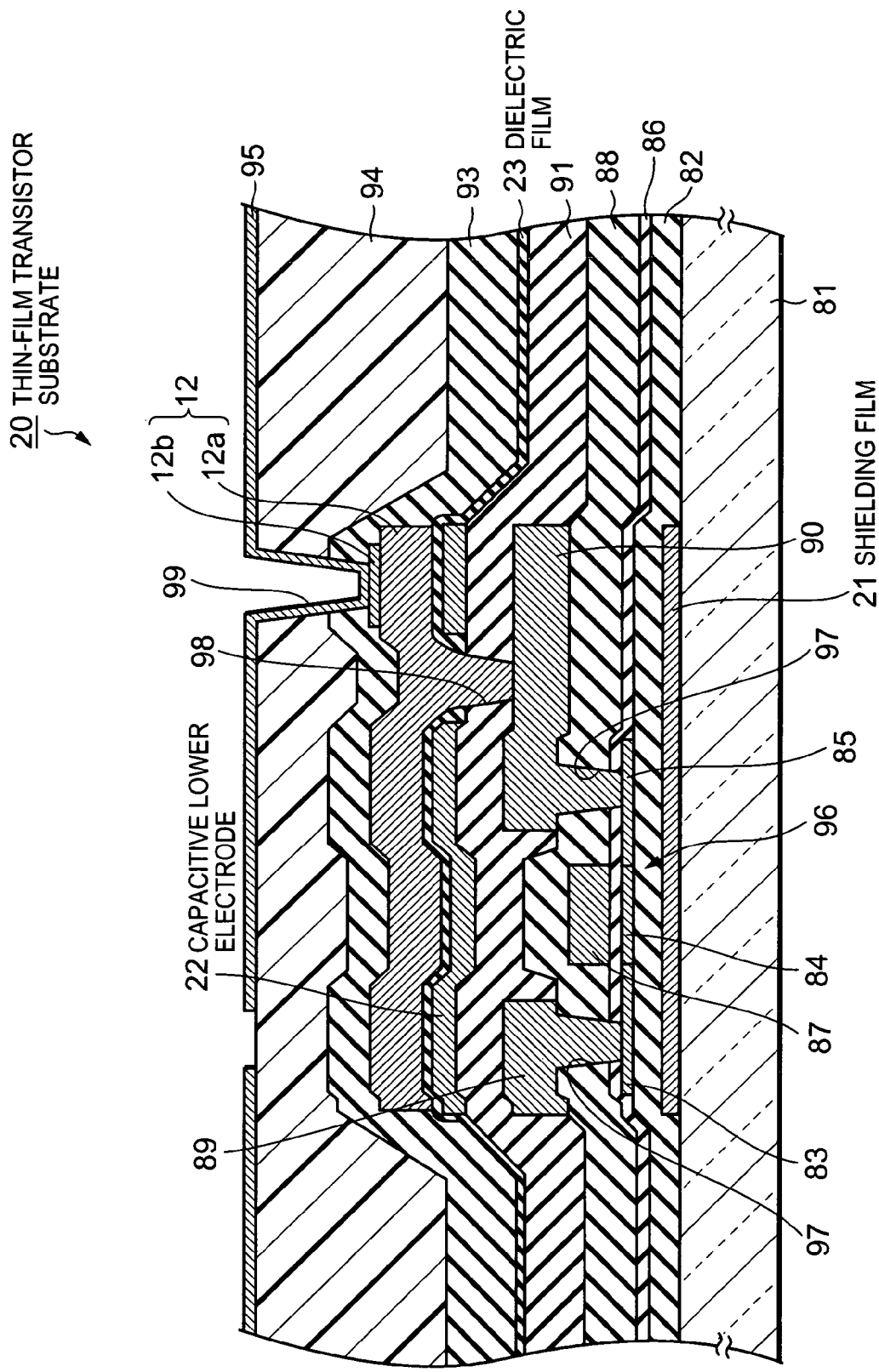
FIG. 3 is a sectional view showing a modification of the first embodiment of the thin film transistor substrate according to the present invention.

In the first embodiment, the thin film transistor substrate 10 having the structure shown in FIG. 1 has been described, however, the invention is not limited to this embodiment. For example, as in a thin film transistor substrate 20 shown in FIG. 3, a shielding film 21 may be also formed on transparent base substrate 81 to prevent a part of projected light from being reflected at the back of the transparent base substrate 81 and from being incident upon an active layer of a thin film transistor 96. As shown in FIG. 3, a capacitive lower electrode 22 and a dielectric film 23 may be also formed under the upper electrode 12.

In the first embodiment, the thin film transistor 96 in which the picture element electrode 95 is connected to the source region 85 via the upper electrode 12 and the source electrode 90 has been described, however, the picture element electrode 95 may be also connected to the source region 85 via only the source electrode 90 without the upper electrode 12. In this case, the similar effect is acquired by forming the drain electrode 89 and the source electrode 90 respectively simultaneously formed by the similar manufacturing method to that of the upper electrode 12 in the first embodiment, that is, by forming the drain electrode 89 and the source electrode 90 substantially as the upper electrode 12.

In the first embodiment, the coplanar-type thin film transistor using the polycrystalline silicon film for the active layer has been described, however, even if an amorphous silicon film is used for an active layer or in a reversely staggered thin film transistor, the similar effect is also acquired.

Figure 4:
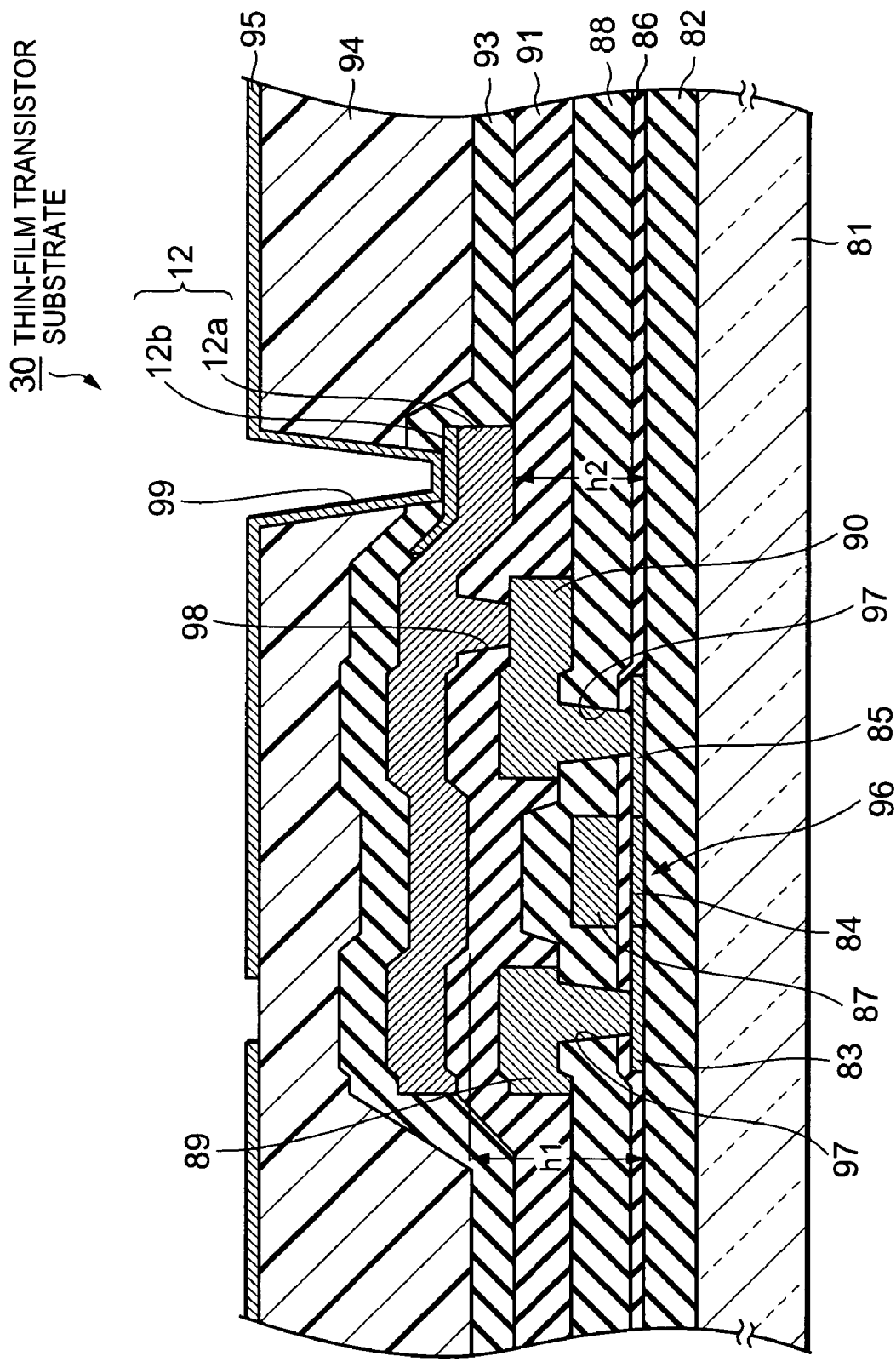
FIG. 4 is a sectional view showing a second embodiment of the thin film transistor substrate according to the present invention.

FIG. 4 is a sectional view showing a second embodiment of the thin film transistor according to the present invention. In a thin film transistor substrate 30 of the second embodiment, if distance from an Al metal layer 12a to transparent base substrate 81 in a region without a high-melting point metal layer 12b on the Al metal layer 12a is h1 and distance from the Al metal layer 12a to the transparent base substrate 81 in a region with the high-melting point metal layer 12b on the Al metal layer 12a is h2, h1>h2.

When the Al metal layer 12a and the high-melting point metal layer 12b are continuously formed on such structure having this difference in level, a difference in thickness is also made in a photoresist film formed on the high-melting point metal layer 12b. As detailedly described later, the photoresist film on the high-melting point metal layer 12b on the Al metal layer 12a spaced apart by the distance h1 is removed by etching the photoresist film utilizing this difference in thickness. If h1−h2>300 nm, a difference in the thickness of the photoresist film is sufficient.

The second embodiment is provided with the following characteristics in addition to the characteristics of the first embodiment. An upper electrode 12 is characterized in that at an uppermost level, that is, at a level at which distance from the transparent base substrate 81 is the longest, an uppermost layer is the Al metal layer 12a, at a level under a contact hole 99 made in a flattening film 94 and a third insulating interlayer 93, an uppermost layer is the high-melting point metal layer 12b and a second layer is the Al metal layer 12a.

FIGS. 5A to 5D are sectional views showing one example of a manufacturing method of the thin film transistor equivalent to the second embodiment. The manufacturing method is different from that in the first embodiment particularly in a method of forming the upper electrode 12.

Figure 5A:
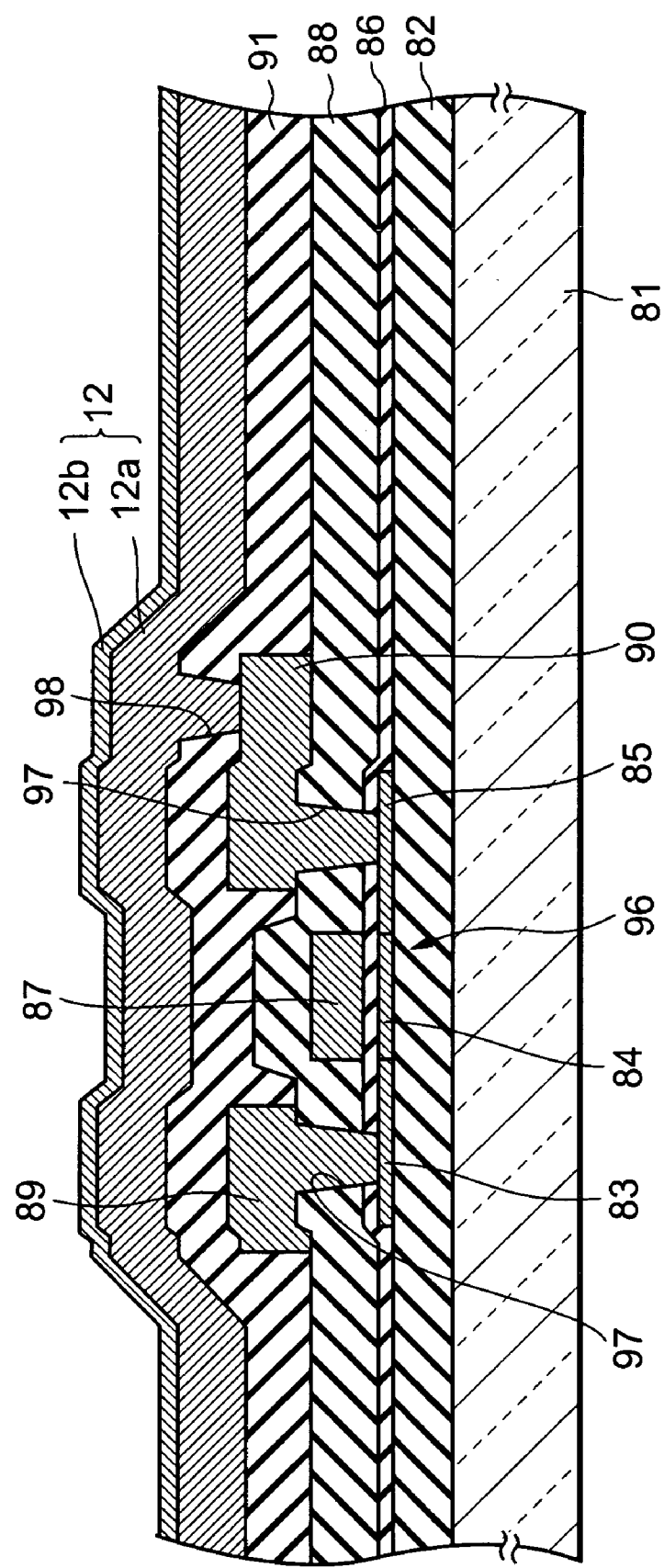
FIGS. 5A-D are a sectional views showing a manufacturing method of the thin film transistor substrate shown in FIG. 4.

As shown in FIG. 5A, processing is made to proceed up to a process in which the Al metal layer 12a and the high-melting point metal layer 12b are continuously deposited by the similar manufacturing method to the manufacturing method of the thin film transistor substrate equivalent to the first embodiment. However, no gate electrode 87, no drain electrode 89 and no source electrode 90 shall be formed under apart in which a contact hole for connecting a picture element electrode and the upper electrode is formed so as to acquire the appropriate difference in level.

Figure 5B:
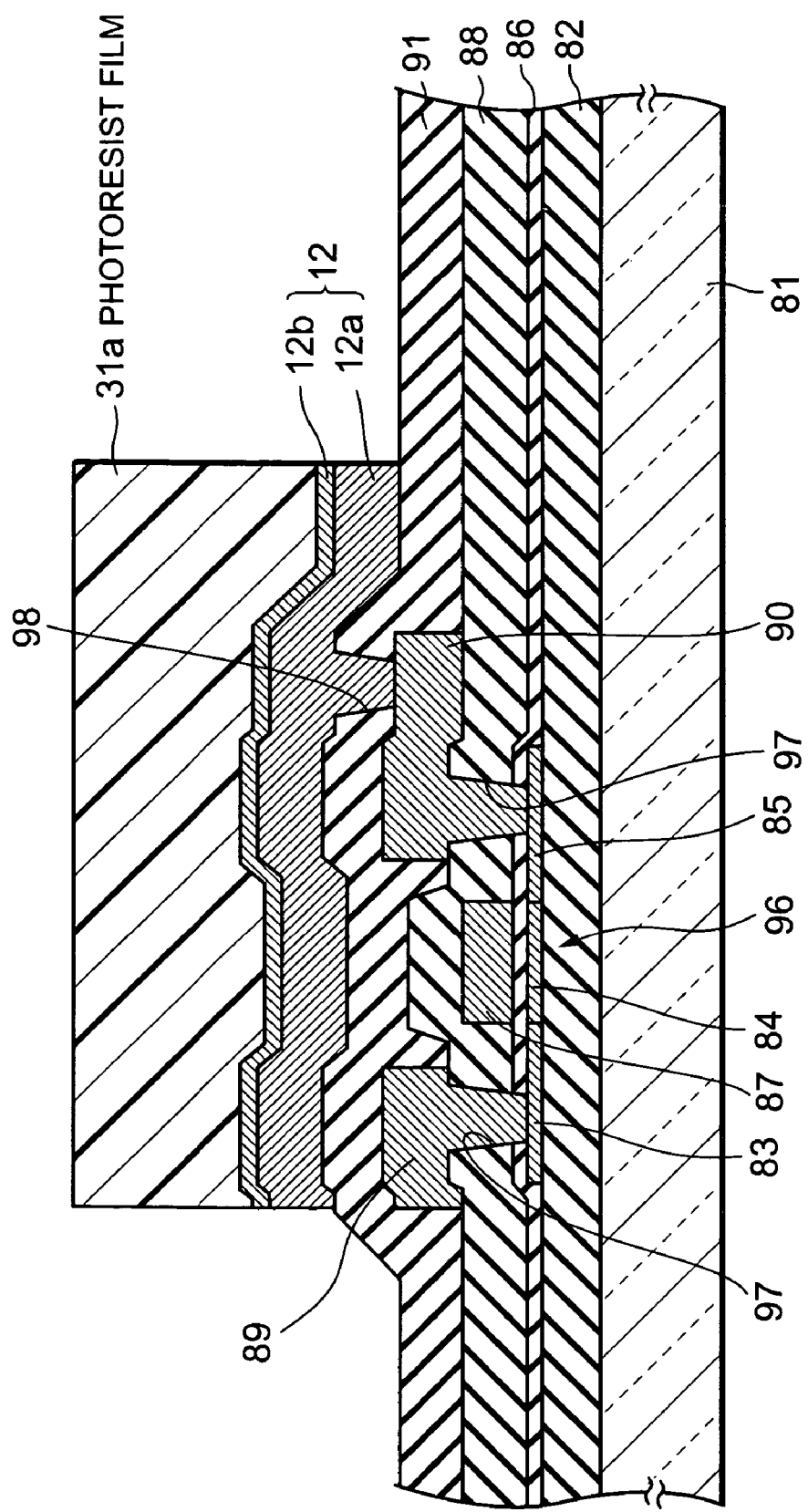

Next, as shown in FIG. 5B, photoresist is applied, exposed and developed are performed, and a photoresist film 31a having a pattern corresponding to the process shape of the Al metal layer 12a is formed. The high-melting point metal layer 12b and the Al metal layer 12a are etched using the photoresist film 31a as a mask, and the high-melting point metal layer 12b and the Al metal layer 12a are processed in the same pattern. In the region without the gate electrode 87, the drain electrode 89 and the source electrode 90, the level is low. Therefore, the photoresist film 31a formed on the region in which these electrodes do not exist, compared with the photoresist film 31a formed on a region in which at least one of these electrodes exist.

Figure 5C:
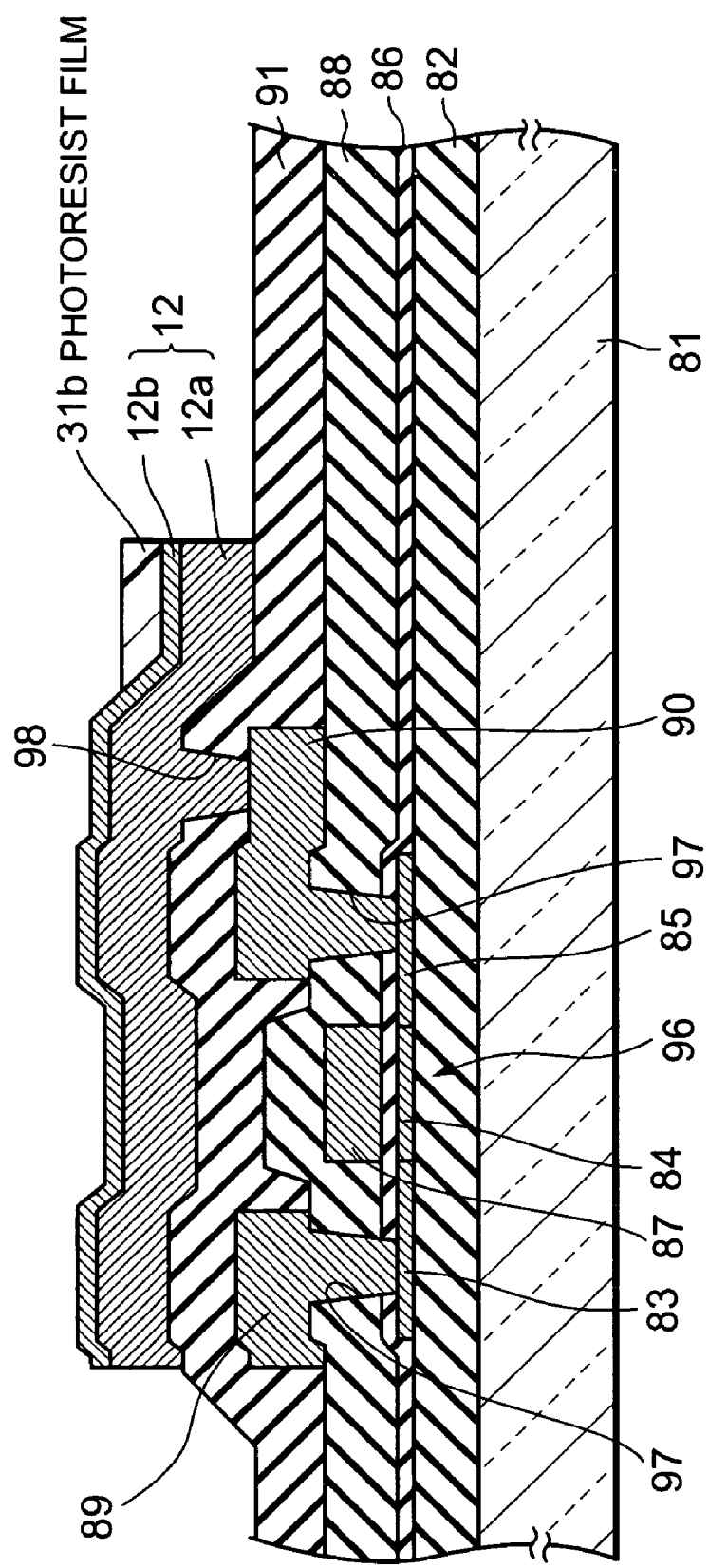

Next, anisotropic etching is applied to the photoresist film 31a by dry etching such as reactive ion etching using the plasma of oxygen or gas acquired by adding a fluorine compound such as $CF_4$ to oxygen by 10% of an oxygen flow rate or less, and the photoresist film 31a is thinned. As shown in FIG. 5C, in a region at an uppermost level in which the photoresist film 31a is the thinnest, the photoresist film 31a disappears, the surface of the high-melting point metal layer 12b is exposed, and in the part in which the contact hole for connecting the picture element electrode and the upper electrode 12 is formed, a part of the photoresist film 31b is left.

Figure 5D:
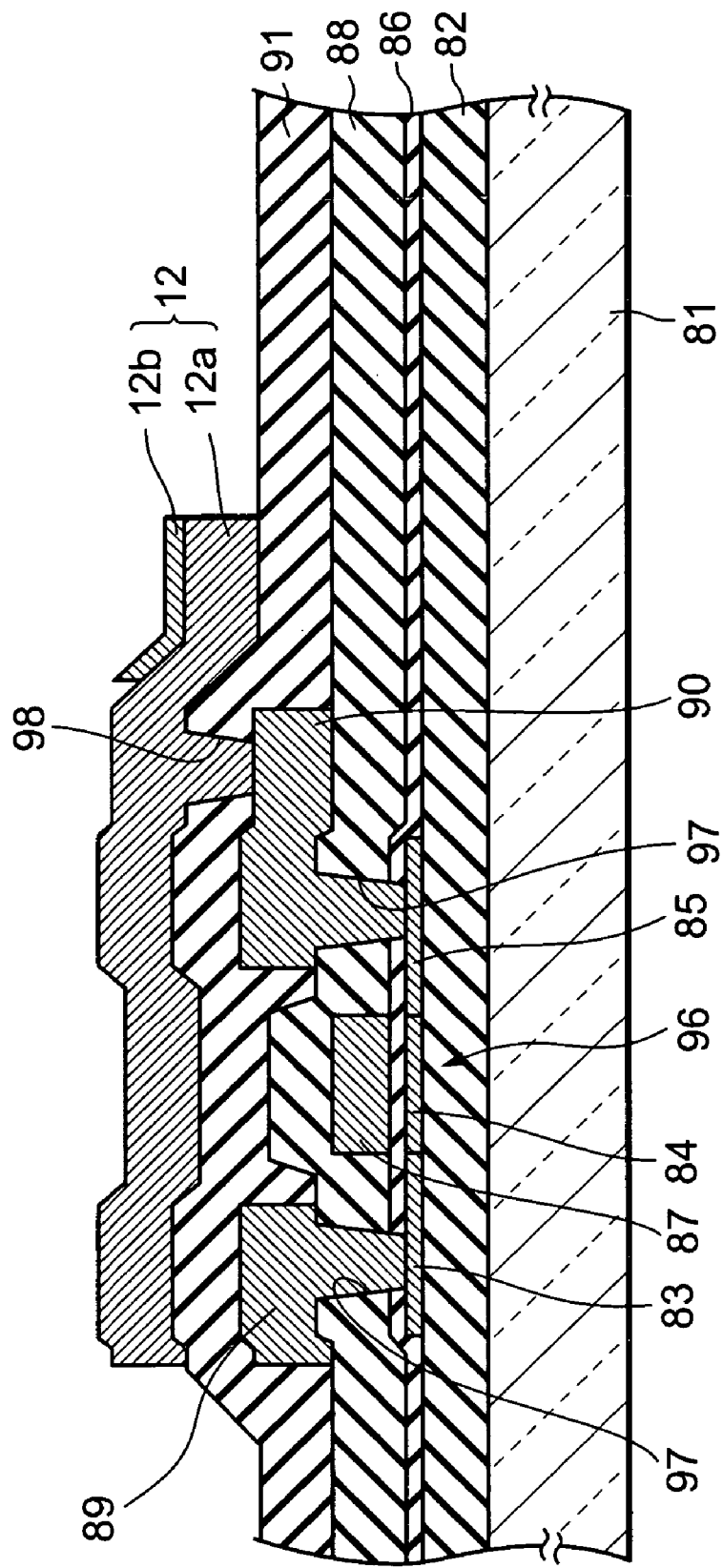

Next, the exposed high-melting point metal layer 12b is selectively etched up to the Al metal layer 12a using the photoresist film 31b as a mask, and the Al metal layer 12a is exposed. As shown in FIG. 5D, the photoresist film 31b is removed and the upper electrode 12 is completed. The etching of the high-melting point metal layer 12b at this time is performed using the similar method to that in the first embodiment.

Afterward, the thin film transistor substrate 30 shown in FIG. 4 is completed by the similar manufacturing method to that in the first embodiment.

As described above, in the second embodiment, as the Al metal layer 12a is also exposed in a part of the upper electrode 12, the reflectance of the upper electrode 12 is enhanced, compared with that in the conventional type thin film transistor substrates shown in FIG. 12, the absorbed amount of light in projection is reduced and the generation of heat is reduced.

Further, as the upper electrode 12 is formed by one lithography utilizing the difference in the thickness of the photoresist film 31a, a photomask for forming the high-melting point metal layer 12b is not required. Therefore, the manufacturing process is simplified, compared with the first embodiment in which two photolithographic processes are required for the formation of the high-melting point metal layer 12b and the formation of the Al metal layer 12a.

In the second embodiment, the difference in a level is made by forming no gate electrode 87, no drain electrode 89 and no source electrode 90 under the part in which the contact hole 99 for connecting the picture element electrode 95 and the upper electrode 12 is formed, however, forming the difference in level is not limited to this method.

Figure 6:
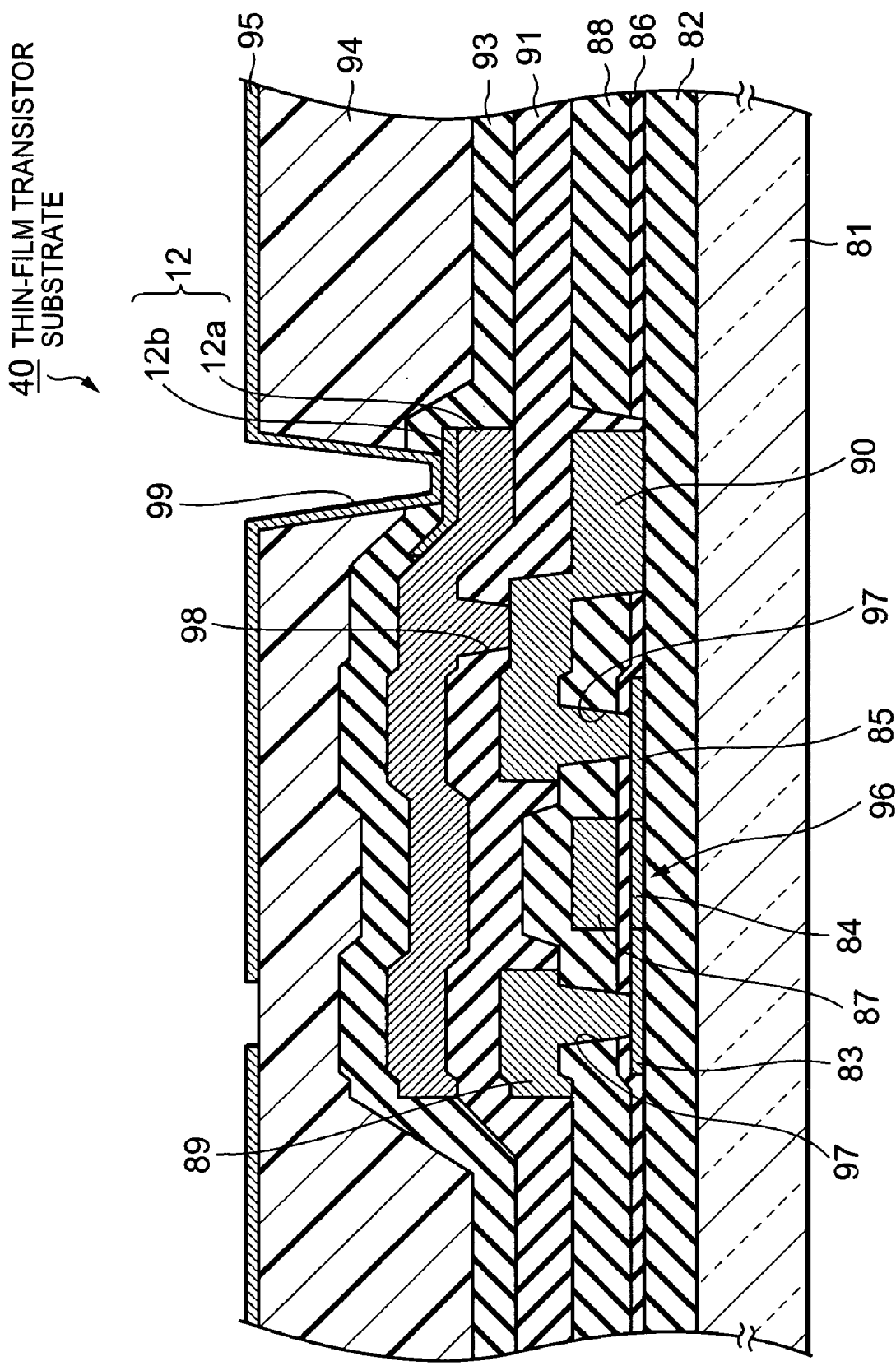
FIG. 6 is a sectional view showing a modification of the second embodiment of the thin film transistor substrate according to the present invention.

For example, as in a thin film transistor substrate 40 shown in FIG. 6, in a process for forming a contact hole 97 in a first insulating interlayer 88 and a gate insulating film 86, the first insulating interlayer 88 and the gate insulating film 86 under a part in which a contact hole 99 for connecting a picture element electrode 95 and an upper electrode 12 is formed are simultaneously etched and difference in a level may be also made. This method is also applied to a thin film transistor in which a picture element electrode 95 is connected to a source region 85 via a source electrode 90, that is, a thin film transistor in which a source electrode 90 also functions as an upper electrode 12.

Figure 7:
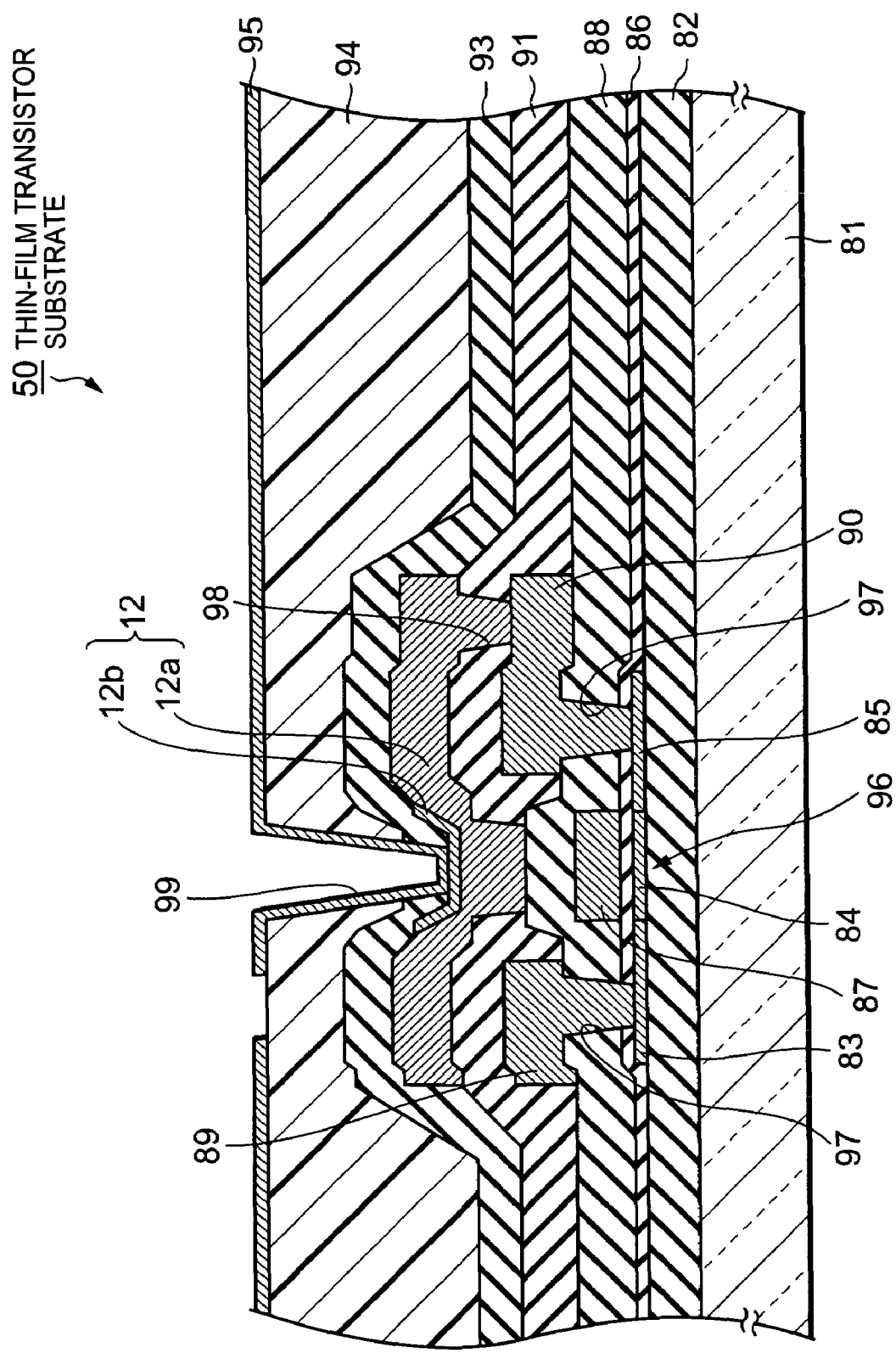
FIG. 7 is a sectional view showing further modification of the second embodiment of the thin film transistor substrate according to the present invention.

In a thin film transistor substrate 50 shown in FIG. 7, in a process for forming a contact hole 98 in a second insulating interlayer 91, the second insulating interlayer 91 over a gate electrode 87 is simultaneously etched and difference in a level may be also made. As described above, the difference in level is also made by simultaneously etching the insulating film under the part in which the contact hole 99 for connecting the picture element electrode 95 and the upper electrode 12 is formed when the contact hole is formed.

FIG. 8 is a sectional view showing the third embodiment of the thin film transistor according to the present invention.

In a thin film transistor substrate 60 of the third embodiment, high-melting point metal layer 12b is not provided in a distance d from the end of Al metal layer 12a and the high-melting point metal layer 12b is provided between these regions. When the Al metal layer 12a and the high-melting pint metal layer 12b are formed, a photoresist film is formed on the high-melting point metal layer 12b and isotropic etching is applied to the photoresist film, and the photoresist film by the distance d inside from the end of the high-melting point metal layer 12b is removed.

It is desirable that the distance d is about 0.3 μm<=d<=about 1 μm. If 0.3 μm>d, a region without the high-melting point metal layer 12b on the Al metal layer 12a is short. If 1 μm<d, isotropic etching is disabled.

The thin film transistor substrate 60 of the third embodiment provides that in upper electrode 12, an uppermost layer is the Al metal layer 12a in the vicinity of the ends, and the uppermost layer is the high-melting point metal layer 12b in a region inside the vicinity of the ends.

Figure 9A:
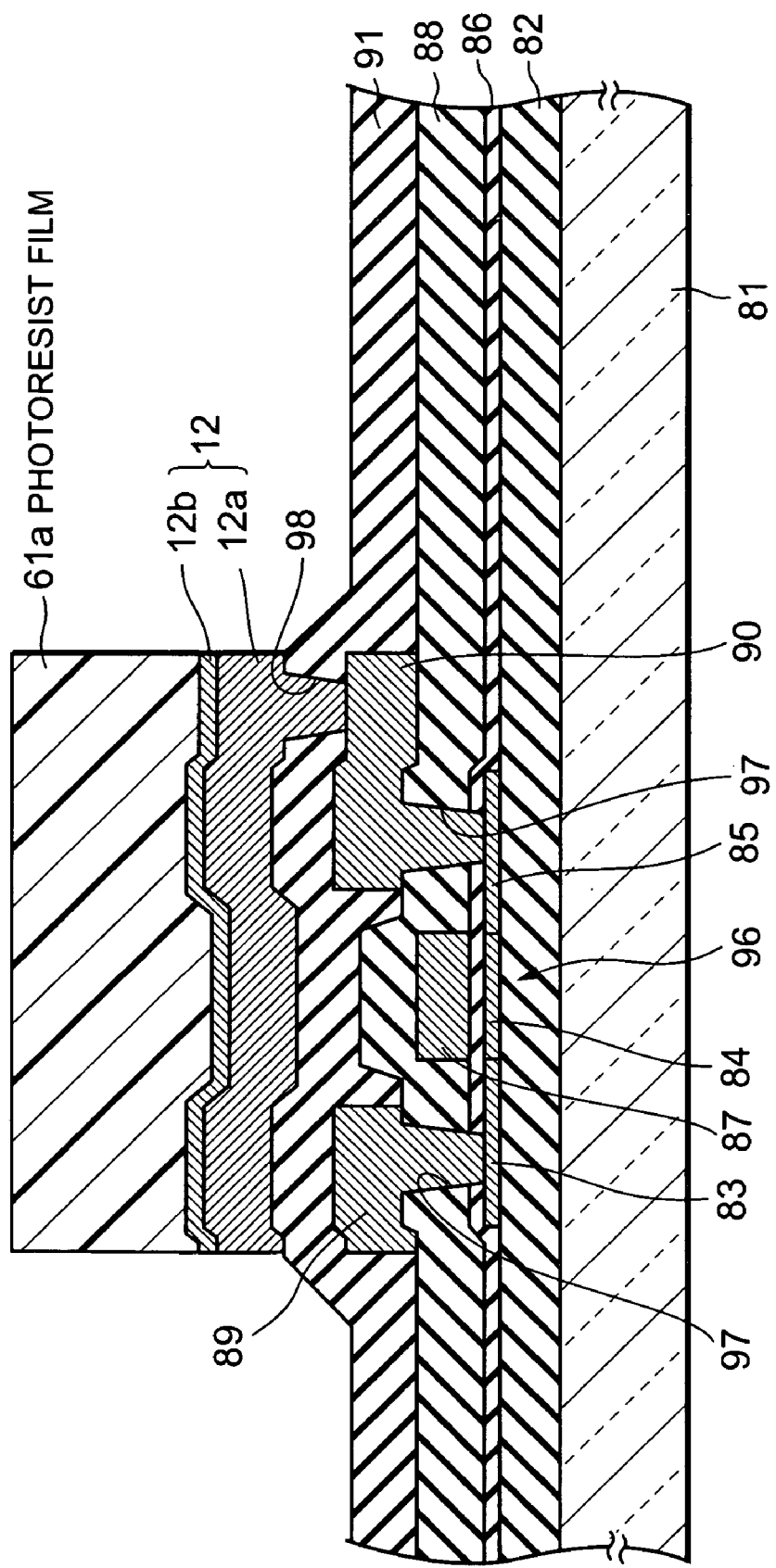
FIGS. 9A-C are a sectional views showing a manufacturing method of the thin film transistor substrate shown in FIG. 8.
Figure 9B:
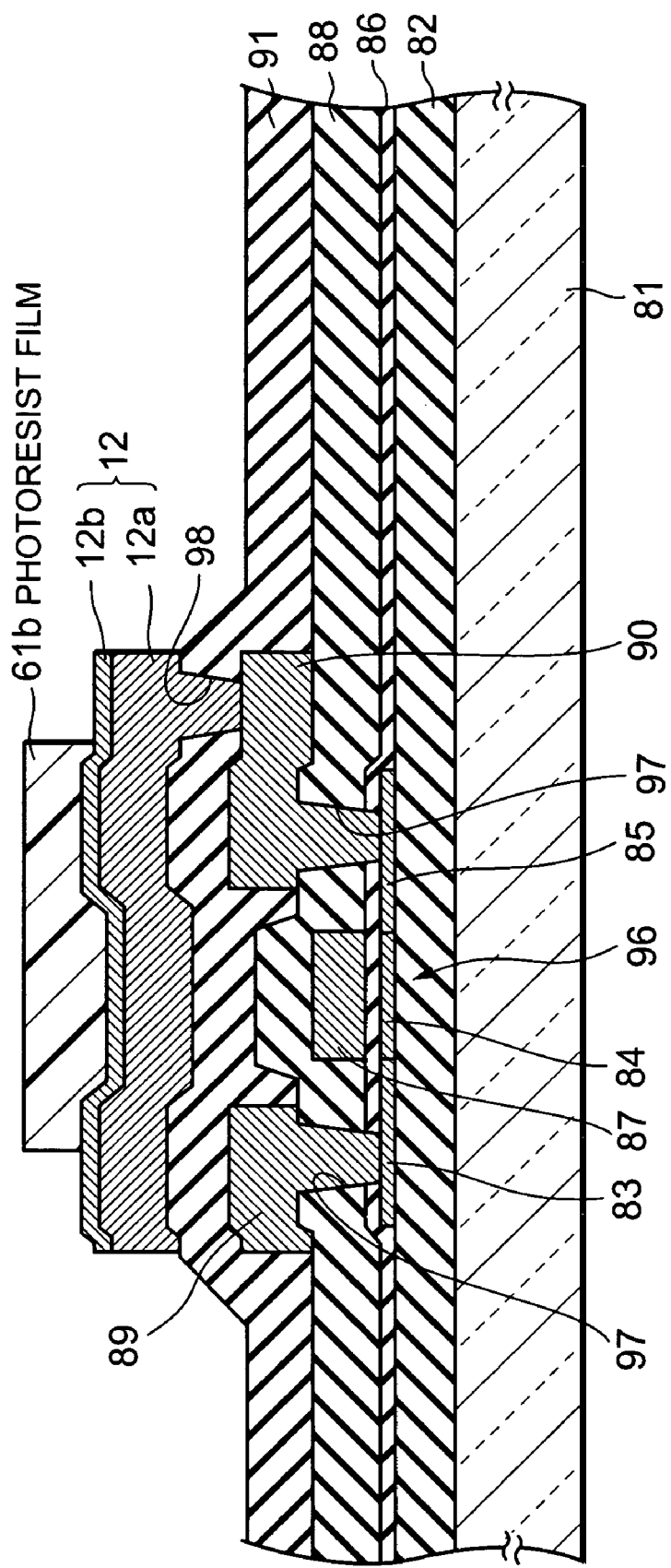
Figure 9C:
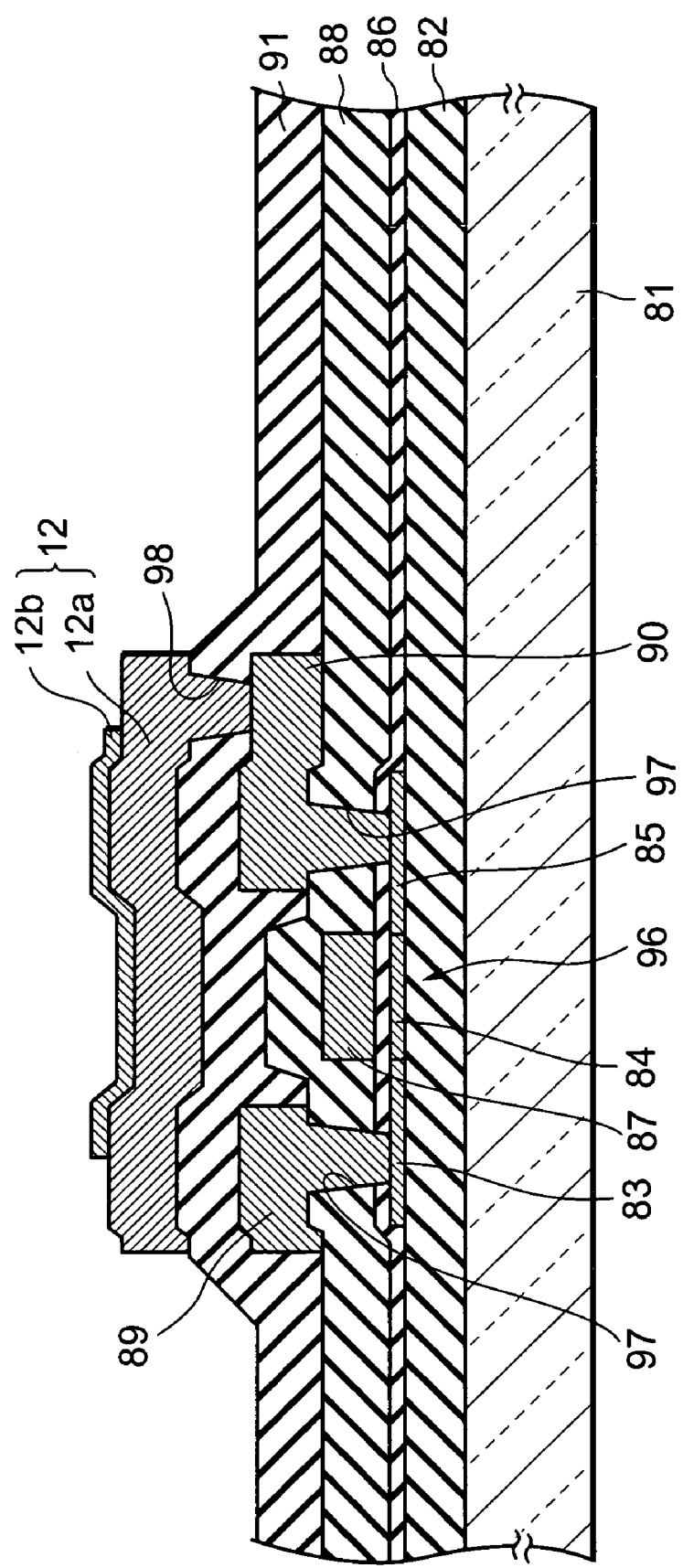

Next, the manufacturing method will be described. It is substantially the same as that in the second embodiment, however, it is different in a method of forming the upper electrode 12. FIGS. 9A to 9C are sectional views showing a method of forming the upper electrode 12 in the manufacturing method in the third embodiment. First, as shown in FIG. 9A, the high-melting point metal layer 12b and the Al metal layer 12a are processed in the same pattern using a photoresist film 61a as a mask as in the second embodiment.

As shown in FIG. 9B, isotropic etching is applied to the photoresist film 61a by dry etching such as plasma etching using the plasma of oxygen or gas acquired by adding a fluorine compound such as $CF_4$ to oxygen by 10% of an oxygen flow rate or less, the surface of the high-melting point metal layer 12b is exposed in a range of about 0.3 to about 1 μm from the end of the upper electrode 12, and a photoresist film 61b is left in further an inner region. Afterward, the exposed high-melting point metal layer 12b is etched as in the second embodiment, the Al metal layer 12a is exposed and the upper electrode shown in FIG. 9C is completed.

As described above, the manufacturing method in the third embodiment is different from the manufacturing method in the second embodiment in that isotropic etching is used for processing the photoresist film 61a for forming the final high-melting point metal layer 12b. Therefore, for the upper electrode 12, the Al metal layer 12a is finally exposed in the vicinity of the end of the pattern. Therefore, since the reflectance of the upper electrode 12 is enhanced, the generation of heat in projection is reduce, compared with that in the conventional type thin film transistor substrates shown in FIG. 12.

As in the second embodiment, as a photolithographic process for forming the final high-melting point metal layer 12b is not required, the manufacturing process is simplified, compared with that in the first embodiment.

In the third embodiment, no special action for locally leaving the high-melting point metal layer 12b is made and it is only in the vicinity of the end of the pattern in the upper electrode 12 that the Al metal layer 12a is exposed. Therefore, when the third embodiment is compared with the first embodiment in which the high-melting point metal layer 12b is formed in the photolithographic process and the second embodiment in which the difference in a level which is a local depression is made and the high-melting point metal layer 12b is left in the part, area in which the Al metal layer 12a is exposed is reduced and it is considered that in the third embodiment, effect for enhancing the reflectance of the upper electrode 12 is low.

Figure 10:
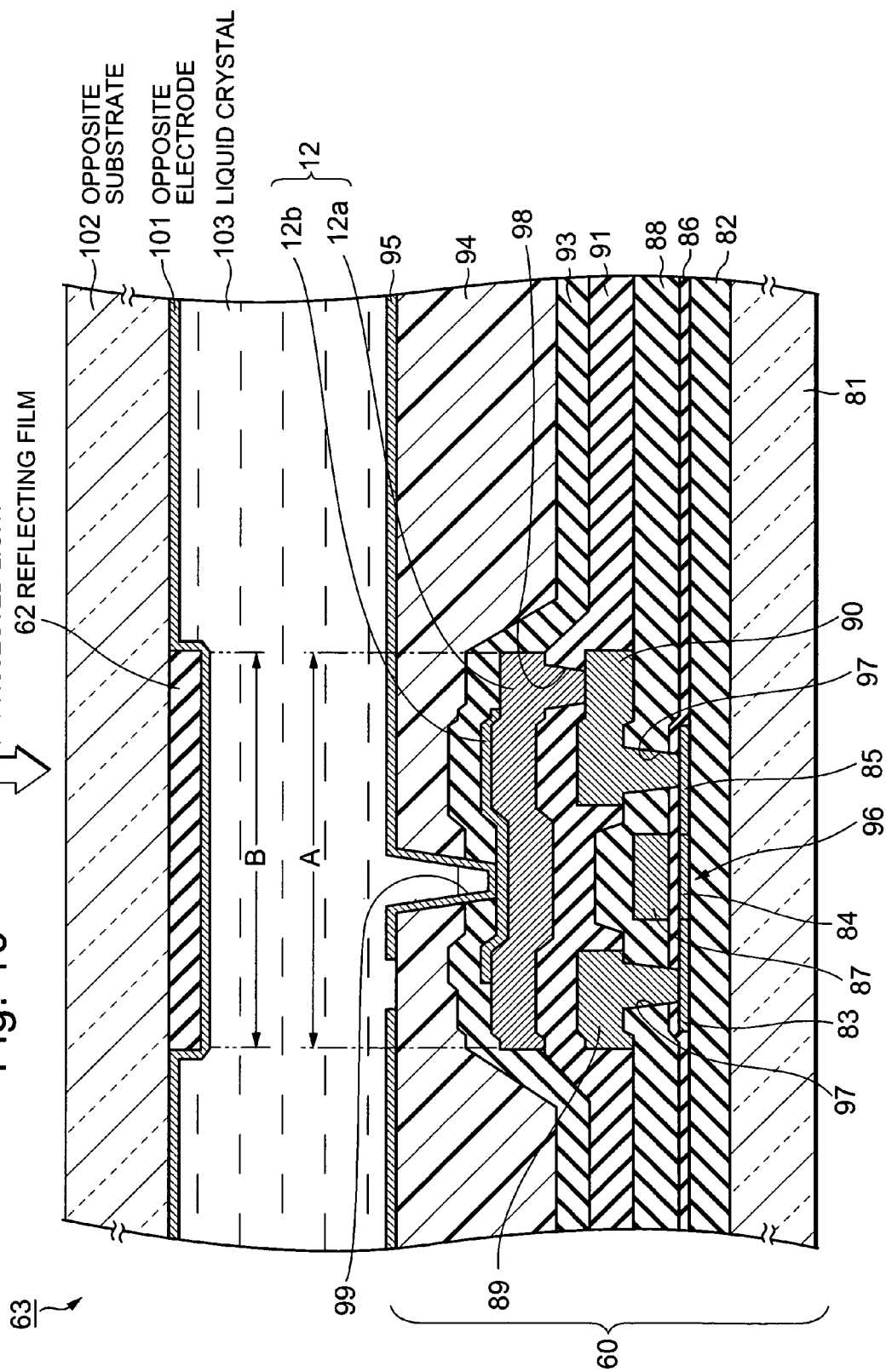
FIG. 10 is a sectional view showing a liquid crystal display using the thin film transistor substrate shown in FIG. 8.

However, in case the thin film transistor substrate of the third embodiment is used for a liquid crystal display 63 provided with a reflecting film 62 to an opposite substrate 102 shown in FIG. 10, even the thin film transistor substrate 60 of the third embodiment produces large effect. In such a liquid crystal display 63, the position of the reflecting film 62 for the position of an upper electrode 12 is often displaced in a range of 1 μm or less because of misregistration when the thin film transistor substrate 60 and the opposite substrate 102 are laminated and others. In that case, as light incident in projection irradiates only the vicinity of the end in the upper electrode 12, sufficient effect is acquired even in the thin film transistor substrate 60 of the third embodiment.

In the liquid crystal display 63 shown in FIG. 10, to prevent the area of an opening in which light is transmitted from being reduced by misregistration between the thin film transistor substrate 60 and the opposite substrate 102, the width B of the reflecting film 62 is sometimes made smaller than the width A of the upper electrode 12. In this case, as light incident in projection irradiates only the vicinity of the end in the upper electrode 12, sufficient effect is acquired even in the thin film transistor substrate 60 of the third embodiment.

Figure 11:
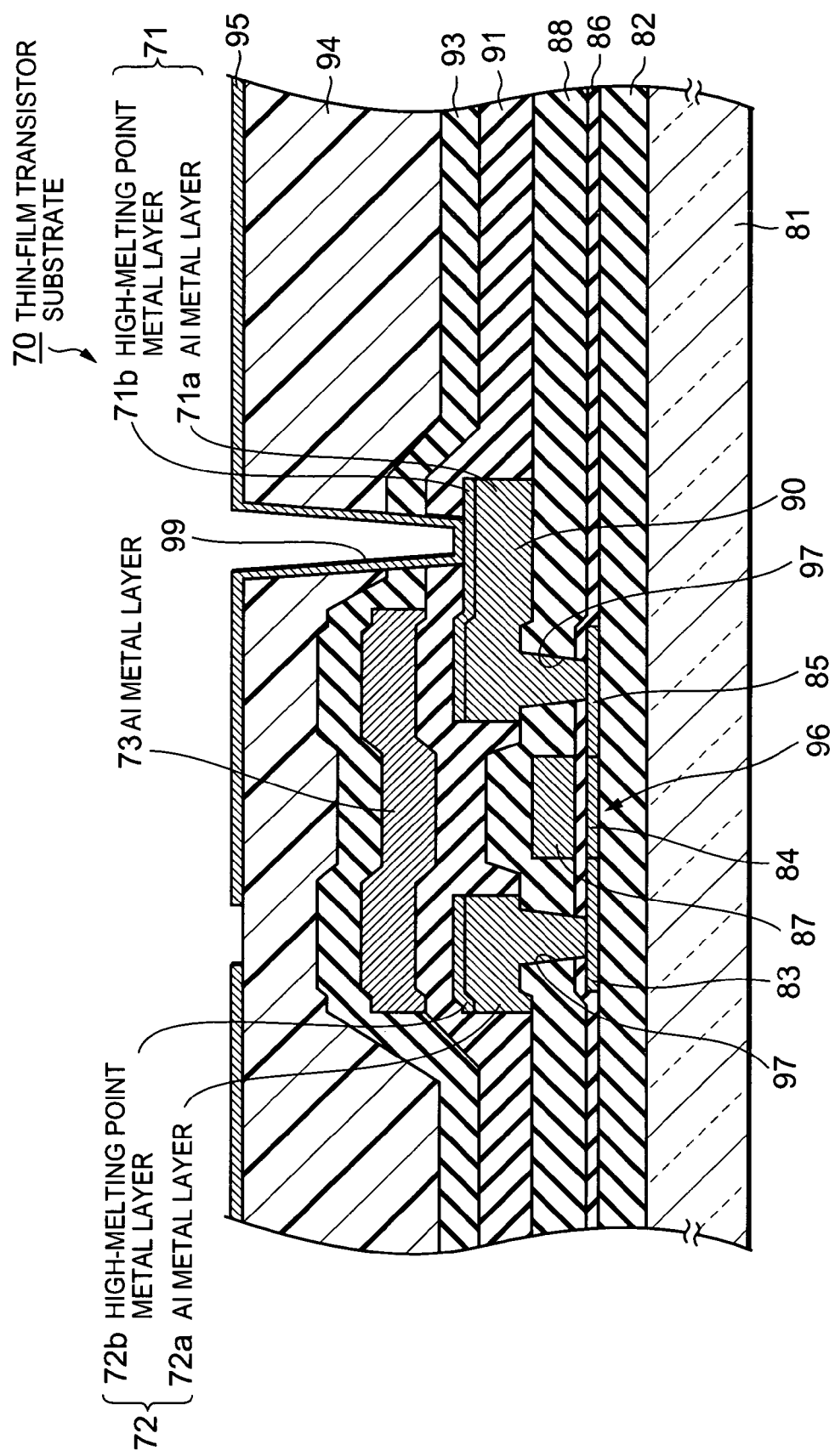
FIG. 11 is a sectional view showing a fourth embodiment of the thin film transistor substrate according to the present invention.

FIG. 11 is a sectional view showing the fourth embodiment of the thin film transistor substrate according to the invention.

A thin film transistor substrate 70 of the fourth embodiment is provided with a thin film transistor 96 provided on transparent base substrate 81, a picture element electrode 95 provided over the thin film transistor 96 and a source electrode 71 as an upper electrode provided between the picture element electrode 95 and the thin film transistor 96 for electrically connecting the picture element electrode 95 and the thin film transistor 96, is used for a transmission type liquid crystal display for a projector, and light is projected from the side of the picture element electrode 95. The source electrode 71 is provided with an Al metal layer 71a and a high-melting point metal layer 71b provided on the Al metal layer 71a and touched to the picture element electrode 95. The high-melting point metal layer 71b has lower contact resistance with the picture element electrode 95 and higher resistivity, compared with the Al metal layer 71a. The fourth embodiment is characterized in that an Al metal layer 73 having higher reflectance, compared with the high-melting point metal layer 71b is provided on the high-melting point metal layer 71b except a part to which the picture element electrode 95 is touched. A second insulating interlayer 91 is provided between the high-melting point metal layer 71b and the Al metal layer 73, a third insulating interlayer 93 is provided between the high-melting point metal layer 71b and the picture element electrode 95, a contact hole 99 is made in the second and third insulating interlayers 91, 93, and the high-melting point metal layer 71b and the picture element electrode 95 are electrically connected via the contact hole 99. As the Al metal layer 73 is provided in a position for preventing projected light from irradiating the thin film transistor 96, the Al metal layer also functions as a shielding film.

The thin film transistor 96 is turned ON/OFF according to a signal input to a gate electrode 87 and applies voltage to the picture element electrode 95 via the source electrode 71. For the source electrode 71, the Al metal layer 71a having low resistivity is used to prevent a problem such as delay by electric resistance and others and the high-melting point metal layer 71b the contact resistance with the picture element electrode 95 is low is provided on the Al metal layer 71a. Besides, on the high-melting point metal layer 72b except a part touched to the picture element electrode 95, the Al metal layer 73 having high reflectance is provided to reflect projected light incident from the side of the picture element electrode 95 and prevent the rise of temperature.

The thin film transistor substrate 70 of the fourth embodiment is different from those in the other embodiments in that the picture element electrode 95 is connected to the source electrode 71 and each lamination structure of the source electrode 71, the drain electrode 72 and the Al metal layer 73 is different. In the fourth embodiment, for the source electrode 71 and the drain electrode 72, the high-melting point metals 71b, 72b are located at an uppermost level and the Al metal layers 71a, 72a mainly composed of Al are located at a second level. In the meantime, the Al metal layer 73 is made of metal mainly composed of Al. The Al metal layer 73 is formed so that it covers the active layer of the thin film transistor 96, the drain electrode 72 and the source electrode 71 except, a part connected to the picture element electrode 95.

As described above, in the fourth embodiment, as the Al metal layer 73 is formed, the absorbed amount of light in projection is reduced and the generation of heat is inhibited as in the first embodiment because the reflectance of the Al metal layer 73 is enhanced, compared with the conventional type thin film transistor shown in FIG. 12.

The high-melting point metal layers 72b, 71b at the uppermost level and the second Al metal layers 72a, 71a in the drain electrode 72 and the source electrode 71 are processed in the same pattern. Therefore, the process for processing the high-melting point metal layer and the Al metal layer in different patterns which is executed in the other embodiments when the upper electrode 12 is formed is not required and the manufacturing process is simplified, compared with other embodiments.

What is claimed is:

1. A thin film transistor substrate comprising:
a transparent insulating substrate;
a thin film transistor on the transparent insulating substrate;
a transparent picture element electrode over the thin film transistor;
a first electrode electrically connecting the transparent picture element electrode and the thin film transistor, the first electrode being distinct from said thin film transistor and including a first metal layer and a second metal layer on the first metal layer, the first metal layer has a region not overlapped by the second metal layer, the first electrode being distinct from the thin film transistor based on at least an interlayer insulating layer being between the first electrode and the thin film transistor; and an insulating layer over said first electrode, said transparent picture element electrode contacting said first electrode through a contact hole formed in said insulating layer, wherein the second metal layer has lower reflectance than the first metal layer, and wherein said second metal layer is formed only in the immediate vicinity of the contact hole.

2. The thin film transistor substrate according to claim 1, wherein the first metal layer is connected to an electrode of the thin film transistor.

3. The thin film transistor substrate according to claim 1, further comprising a shielding film between the base substrate and the thin film transistor.

4. The thin film transistor substrate according to claim 1, further comprising a capacitor between the first electrode and the thin film transistor.

5. The thin film transistor substrate according to claim 4, wherein the first metal layer is a capacitive upper electrode of the capacitor.

6. The thin film transistor substrate according to claim 1, further comprising a shielding layer over the second metal layer.

7. The thin film transistor substrate according to claim 6, further comprising an opposite substrate that faces the thin film transistor substrate through a liquid crystal and the shielding layer is on the opposite substrate.

8. The thin film transistor substrate according to claim 1, wherein the first metal layer is made of Al or an alloy mainly composed of Al and the second metal layer is made of high-melting point metal.

9. The thin film transistor substrate according to claim 8, wherein the high-melting point metal is a metal selected from the group consisting of Ti, W, Mo, Ta, Cr and an alloy of two or more of these.

* * * * *